(12) United States Patent
Kurachi et al.

(10) Patent No.: US 11,688,773 B2
(45) Date of Patent: Jun. 27, 2023

(54) METHOD FOR MANUFACTURING SEMICONDUCTOR DEVICE AND SEMICONDUCTOR DEVICE

(71) Applicant: SUMITOMO ELECTRIC DEVICE INNOVATIONS, INC., Kanagawa (JP)

(72) Inventors: Shunsuke Kurachi, Yokohama (JP); Tsutomu Komatani, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 22 days.

(21) Appl. No.: 16/791,547

(22) Filed: Feb. 14, 2020

(65) Prior Publication Data

US 2020/0266275 A1    Aug. 20, 2020

(30) Foreign Application Priority Data

Feb. 19, 2019 (JP) .................................. 2019-027429

(51) Int. Cl.
   *H01L 29/417* (2006.01)
   *H01L 21/768* (2006.01)
   (Continued)

(52) U.S. Cl.
   CPC ...... *H01L 29/2003* (2013.01); *H01L 21/3065* (2013.01); *H01L 21/76898* (2013.01);
   (Continued)

(58) Field of Classification Search
   CPC ........... H01L 29/4175; H01L 21/76898; H01L 23/481; H01L 29/41758; H01L 29/66431; H01L 29/66462; H01L 29/778–7789
   See application file for complete search history.

(56) References Cited

U.S. PATENT DOCUMENTS

| 5,501,893 A * | 3/1996 | Laermer ............. H01L 21/3065 216/67 |
| 2003/0077910 A1* | 4/2003 | Westerman ....... H01J 37/32082 438/714 |

(Continued)

FOREIGN PATENT DOCUMENTS

| JP | 2002-151478 | 5/2002 |
| JP | 2006-196764 | 7/2006 |

(Continued)

*Primary Examiner* — Eric A. Ward

(74) *Attorney, Agent, or Firm* — Smith, Gambrell & Russell, LLP.

(57) ABSTRACT

Disclosure is a method for manufacturing a semiconductor device. The method includes forming a source electrode and a drain electrode on a nitride semiconductor layer formed on a main surface of a SiC substrate, forming a gate electrode having a laminated structure including a Ni layer and an Au layer on the Ni layer between the source electrode and the drain electrode on the nitride semiconductor layer and forming a first metal film having the same laminated structure as the gate electrode in a region adjacent to the source electrode with an interval therebetween, forming a second metal film to contact with the source electrode and the first metal film, forming a hole being continuous with the first metal film from a back surface of the SiC substrate, and forming a metal via being continuous with the first metal film from the back surface in the hole.

16 Claims, 10 Drawing Sheets

(51) Int. Cl.
*H01L 29/778* (2006.01)
*H01L 29/20* (2006.01)
*H01L 21/3065* (2006.01)
*H01L 29/40* (2006.01)

(52) U.S. Cl.
CPC ...... *H01L 29/402* (2013.01); *H01L 29/41758* (2013.01); *H01L 29/7786* (2013.01)

(56) References Cited

U.S. PATENT DOCUMENTS

| | | | |
|---|---|---|---|
| 2004/0050685 A1 | 3/2004 | Yara et al. | |
| 2006/0157735 A1 | 7/2006 | Kanamura et al. | |
| 2008/0067563 A1* | 3/2008 | Kawasaki | H01L 29/4175 257/289 |
| 2008/0073752 A1 | 3/2008 | Asai et al. | |
| 2010/0295100 A1* | 11/2010 | Huang | H03H 9/0542 257/256 |
| 2011/0115025 A1* | 5/2011 | Okamoto | H01L 29/4175 257/368 |
| 2012/0175777 A1* | 7/2012 | Hill | H01L 23/481 257/753 |
| 2013/0288401 A1* | 10/2013 | Matsuura | H01L 22/10 438/14 |
| 2015/0001721 A1* | 1/2015 | Nishi | H01L 21/283 257/751 |
| 2018/0240753 A1* | 8/2018 | LaRoche | H01L 21/28264 |
| 2019/0148498 A1* | 5/2019 | Lee | H01L 29/78 257/76 |
| 2020/0091301 A1* | 3/2020 | Pan | H01L 29/7786 |
| 2020/0395474 A1* | 12/2020 | Bothe | H01L 29/7786 |
| 2021/0175337 A1* | 6/2021 | Tsunami | H01L 23/481 |

FOREIGN PATENT DOCUMENTS

| | | |
|---|---|---|
| JP | 2008-085020 | 4/2008 |
| JP | 2012-033690 | 2/2012 |
| JP | 2013-098274 | 5/2013 |
| JP | 2013-191763 | 9/2013 |

* cited by examiner

METHOD FOR MANUFACTURING SEMICONDUCTOR DEVICE AND SEMICONDUCTOR DEVICE

CROSS-REFERENCE TO RELATED APPLICATIONS

This application is based upon and claims the benefit of priority from Japanese Patent Application No. 2019-027429, filed on Feb. 19, 2019, the entire contents of which are incorporated herein by reference.

TECHNICAL FIELD

The present disclosure relates to a method for manufacturing a semiconductor device and a semiconductor device.

BACKGROUND

JP2013-191763A discloses a method for manufacturing a semiconductor device. The method described in this document includes forming a via hole including a first hole and a second hole having a smaller diameter than the first hole from the back surface of a semiconductor substrate having a compound semiconductor laminated structure near a front surface. The forming of the via hole includes forming the first hole in the semiconductor substrate in which an etched bottom surface becomes a curved surface through dry etching, a center portion of the etched bottom surface has the compound semiconductor laminated structure, and an outer peripheral portion of the etched bottom surface serves as the semiconductor substrate, and forming the second hole in the compound semiconductor laminated structure by wet etching using the semiconductor substrate at the outer peripheral portion of the etched bottom surface as a mask.

JP2008-085020A discloses a structure of a semiconductor device. The semiconductor device described in this document includes a semiconductor element, a blocking film, a first via wiring, and a second via wiring. The semiconductor element is formed on a first surface of a semiconductor substrate. The blocking film is provided in a first via hole formed in the first surface of the semiconductor substrate to have a depressed shape. The blocking film contains at least one or more group 8 elements. The first via wiring is in contact with the blocking film and is connected to an electrode of the semiconductor element. The second via wiring is formed in a second via hole which extends to the blocking film and is formed in a depressed shape on the second surface which faces the first surface of the semiconductor substrate. The second via wiring is electrically connected to the first via wiring via the blocking film and becomes a part of a wiring formed on the second surface. JP2012-033690A discloses a semiconductor device and a semiconductor method.

SUMMARY

The present disclosure provides a method for manufacturing a semiconductor device. The method for manufacturing a semiconductor device includes forming a source electrode and a drain electrode on a nitride semiconductor layer formed on a main surface of a SiC substrate, forming a gate electrode having a laminated structure including a Ni layer and an Au layer on the Ni layer between the source electrode and the drain electrode on the nitride semiconductor layer and forming a first metal film having the same laminated structure as the gate electrode in a region adjacent to the source electrode with an interval therebetween, forming a second metal film to contact with the source electrode and the first metal film, forming a hole being continuous with the first metal film from a back surface of the SiC substrate, and forming a metal via being continuous with the first metal film from the back surface in the hole.

The present disclosure provides a semiconductor device. The semiconductor device includes a SiC substrate, a nitride semiconductor layer provided on a main surface of the SiC substrate, a source electrode and a drain electrode provided on the nitride semiconductor layer, a gate electrode provided between the source electrode and the drain electrode on the nitride semiconductor layer and having a laminated structure including a Ni layer and an Au layer on the Ni layer, a first metal film provided in a region adjacent to the source electrode with an interval therebetween on the nitride semiconductor layer and having the same laminated structure as the gate electrode, a second metal film contacting with the source electrode and the first metal film, and a metal via provided in a hole of the SiC substrate, the metal via being continuous from a back surface of the SiC substrate to the first metal film.

BRIEF DESCRIPTION OF THE DRAWINGS

The foregoing and other purposes, aspects, and advantages will be better understood from the following detailed description of embodiments of the disclosure with reference to the drawings, in which.

DETAILED DESCRIPTION

Figure 1:
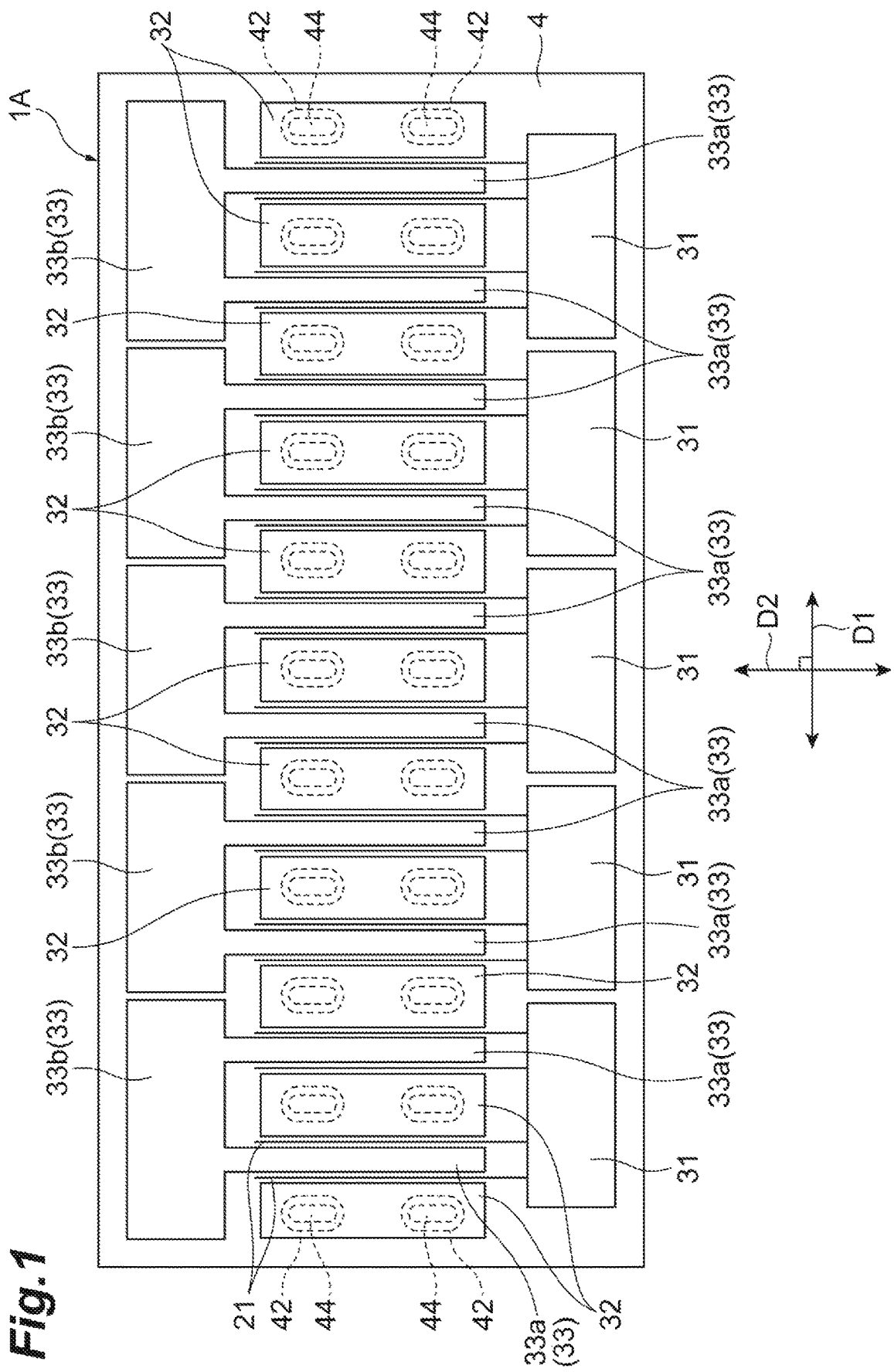
FIG. 1 is a plan view showing a configuration of a transistor as a semiconductor device according to one embodiment.

Problems to be Solved by the Present Disclosure

In recent years, with the progress of semiconductor technology, there has arisen a demand for a reduction in size of a semiconductor element and corresponding miniaturization of internal components. In a transistor, a so-called island source via (ISV) in which a via is formed immediately below a source finger is effective to improve high-frequency characteristics, specifically, to improve and stabilize a gain by reducing source inductance. However, in the case of a nitride-based semiconductor device, a chlorine-based gas is generally used to form a hole for a via, and Al which is a main material of a source electrode is easily etched by chlorine-based gases. Thus, it is difficult to form the via immediately below the source electrode.

Advantageous Effects of the Present Disclosure

According to the present disclosure, a via can be easily formed immediately below a source finger in a semiconductor device.

Description of Embodiments of the Present Disclosure

First, contents of embodiments of the present disclosure will be listed and described. A method for manufacturing a semiconductor device according to one embodiment includes forming a source electrode and a drain electrode on a nitride semiconductor layer formed on a main surface of a SiC substrate, forming a gate electrode having a laminated structure including a Ni layer and an Au layer on the Ni layer between the source electrode and the drain electrode on the nitride semiconductor layer and forming a first metal film having the same laminated structure as the gate electrode in a region adjacent to the source electrode with an interval therebetween, forming a second metal film to contact with the source electrode and the first metal film, forming a hole being continuous with the first metal film from a back surface of the SiC substrate, and forming a metal via being continuous with the first metal film from the back surface in the hole.

As one embodiment, in the forming of the hole, the SiC substrate may be etched by reactive ion etching using a fluorine-based gas, and then the nitride semiconductor layer may be etched by reactive ion etching using a chlorine-based gas. In this case, in the forming of the hole, fluorine ions derived from the fluorine-based gas may be intermittently radiated onto the SiC substrate. Further, in the forming of the hole, chlorine ions derived from a chlorine-based gas may be intermittently radiated onto the nitride semiconductor layer.

As one embodiment, the source electrode may have an opening, and the first metal film may be formed inside the opening.

As one embodiment, a planar shape of the source electrode may be a U shape, and the first metal film may be formed inside the U shape.

As one embodiment, the laminated structure may include a Pd layer between the Ni layer and the Au layer.

As one embodiment, the forming of the source electrode and the drain electrode may include alloying a multilayer metal mainly containing Al at a temperature in a range of 500° C. to 600° C.

A semiconductor device according to one embodiment includes a SiC substrate, a nitride semiconductor layer provided on a main surface of the SiC substrate, a source electrode and a drain electrode provided on the nitride semiconductor layer, a gate electrode provided between the source electrode and the drain electrode on the nitride semiconductor layer and having a laminated structure including a Ni layer and an Au layer on the Ni layer, a first metal film provided in a region adjacent to the source electrode with an interval therebetween on the nitride semiconductor layer and having the same laminated structure as the gate electrode, a second metal film contacting with the source electrode and the first metal film, and a metal via provided in a hole of the SiC substrate, the metal via being continuous from a back surface of the SiC substrate to the first metal film.

As one embodiment, the source electrode and the drain electrode may mainly contain Al.

As one embodiment, the source electrode may have an opening, and the first metal film may be provided inside the opening.

As one embodiment, a planar shape of the source electrode may be a U shape, and the first metal film may be formed inside the U shape.

As one embodiment, the source electrode may have a width of at least 30 µm.

Details of Embodiments of the Present Disclosure

Specific examples of a method for manufacturing a semiconductor device and a semiconductor device according to an embodiment of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted.

Figure 2:
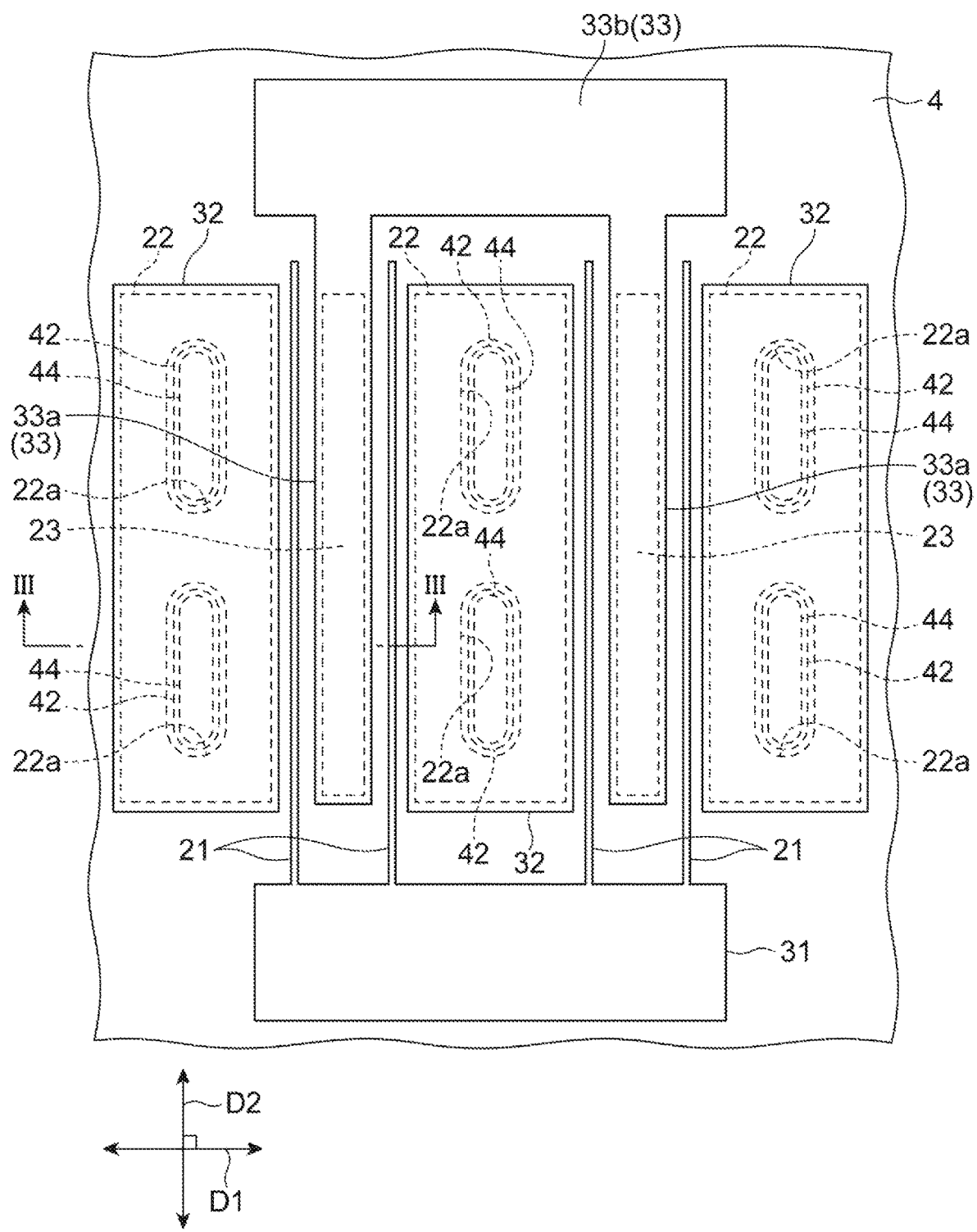
FIG. 2 is an enlarged plan view showing a part of the transistor shown in FIG. 1.
Figure 3:
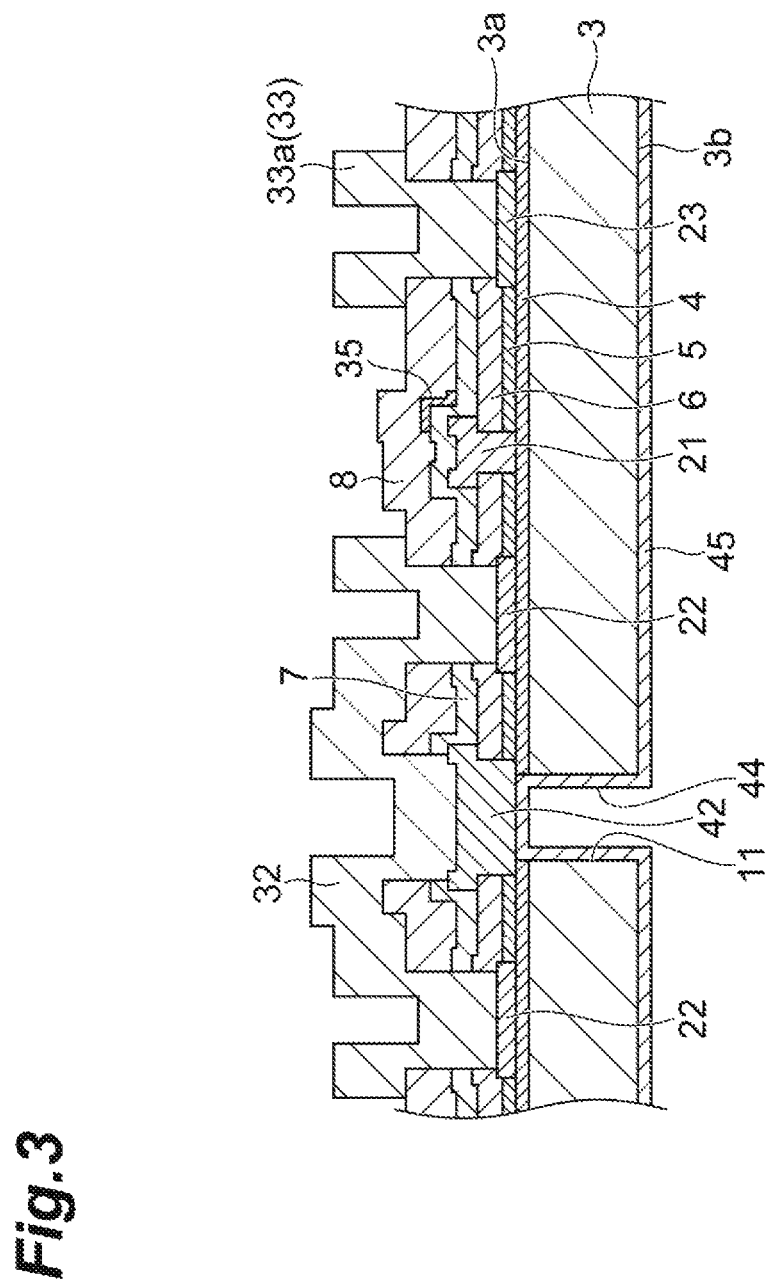
FIG. 3 is a cross-sectional view of a part of the transistor along line III-III in FIG. 2.

FIG. 1 is a plan view showing a configuration of a transistor 1A as a semiconductor device according to one embodiment. FIG. 2 is an enlarged plan view showing a part of the transistor 1A shown in FIG. 1. FIG. 3 is a cross-sectional view of a part of the transistor 1A along line III-III in FIG. 2. As shown in FIGS. 1 to 3, the transistor 1A includes a SiC substrate 3, a nitride semiconductor layer 4, insulating films 5 to 8, a gate electrode (a gate finger) 21, a source electrode 22, a drain electrode 23, a gate wiring 31, a source wiring 32, a drain wiring 33, a field plate 35, a metal film 42 and a metal via 44.

The SiC substrate 3 is a substrate which is formed of SiC and has a flat main surface 3a and a flat back surface 3b located on the side opposite to the main surface 3a. The SiC substrate 3 is used for epitaxial growth of the nitride semiconductor layer 4. A thickness of the SiC substrate 3 is, for example, in a range of 50 µm to 120 µm and is 100 µm in one example.

The nitride semiconductor layer 4 is an epitaxial layer formed on the main surface 3a of the SiC substrate 3. When the transistor 1A is a high electron mobility transistor (HEMT), the nitride semiconductor layer 4 includes, for example, an AlN buffer layer in contact with the main surface 3a, a GaN channel layer provided on the AlN buffer layer, an AlGaN (or InAlN) barrier layer provided on the GaN channel layer, and a GaN cap layer provided on the barrier layer. In some cases, the GaN cap layer may be omitted. The AlN buffer layer is undoped and has a thickness in a range of, for example, 10 nm to 30 nm. The GaN channel layer is undoped and has a thickness in a range of, for example, 0.3 µm to 2.0 µm. A thickness of the barrier layer is, for example, in a range of 10 nm to 30 nm. In the case of an InAlN barrier layer, a thickness thereof is set to be smaller than 20 nm. The GaN cap layer is n-type and has a thickness of, for example, 1.5 nm to 5 nm.

The insulating films 5 to 8 constitute an insulating laminated structure located on the nitride semiconductor layer 4. For example, the insulating films 5 to 8 are formed of, for example, a silicon compound such as SiN, $SiO_2$, or SiON. In the embodiment, the insulating films 5 to 8 are in contact with each other, but another layer may be provided in at least one interlayer. When the insulating films 5 to 8 are SiN layers, a thickness of the insulating film 5 is, for example, in a range of 10 nm to 30 nm, a thickness of the insulating film 6 is, for example, in a range of 30 nm to 90 nm, a thickness of the insulating film 7 is, for example, in a range of 150 nm to 500 nm, and a thickness of the insulating film 8 is, for example, in a range of 100 nm to 1000 nm.

A plurality of source electrodes 22 are provided on an active region of the nitride semiconductor layer 4 and are in ohmic contact with the nitride semiconductor layer 4. As shown in FIG. 2, the plurality of source electrodes 22 are arranged in a direction D1 along the main surface 3a, and a planar shape of each of the source electrodes 22 is a rectangular shape with a direction D2 intersecting the direction D1 as a longitudinal direction. Each of the source electrodes 22 has one or more (two in the drawing) openings 22a. The two openings 22a have, for example, rectangular shapes or elliptical shapes with the direction D2 as a longitudinal direction and are arranged in the direction D2. The source electrodes 22 are formed by, for example, alloying a laminated structure including a Ti layer, an Al layer, and a Ti layer (or a Ta layer, an Al layer, and a Ta layer) and mainly contain Al. The source electrodes 22 have widths of at least 30 µm in the direction D1 which is a transverse direction.

A plurality of drain electrodes 23 are provided on the active region of the nitride semiconductor layer 4 and are in ohmic contact with the nitride semiconductor layer 4. As shown in FIG. 2, the plurality of drain electrodes 23 are alternately arranged with the source electrodes 22 in the direction D1, and a planar shape of each of the drain electrodes 23 is a rectangular shape with the direction D2 as longitudinal direction. The drain electrodes 23 are also formed by alloying a laminated structure including, for example, a Ti layer, an Al layer, and a Ti layer (or a Ta layer, an Al layer, and a Ta layer) and mainly contain Al.

A plurality of gate electrodes (gate fingers) 21 are provided on the active region of the nitride semiconductor layer 4. Each of the gate electrodes 21 extends in the direction D2 and is located between a source electrode 22 and a drain electrode 23. The gate electrodes 21 are in Schottky contact with the nitride semiconductor layer 4. A contact width (a gate length) between the gate electrodes 21 and the nitride semiconductor layer 4 in the direction D1 is, for example, 0.5 µm. The gate electrodes 21 have a laminated structure including a Ni layer and a Au layer on the Ni layer. In one example, the Ni layer is in contact with the nitride semiconductor layer 4, and the Au layer is in contact with the Ni layer. Alternatively, a Pd layer may be interposed between the Ni layer and the Au layer. In this case, a thickness of the Ni layer is, for example, 50 nm to 100 nm, a thickness of the Pd layer is, for example, 20 nm to 70 nm, and a thickness of the Au layer is, for example, 100 nm to 500 nm.

The field plate 35 is a metal film provided along the gate electrode 21. The insulating film 7 is interposed between the field plate 35 and the gate electrode 21. The field plate 35 has, for example, a laminated structure of a Ti layer (or a Ta layer) and a Au layer. A thickness of the Ti layer is, for example, in a range of 3 nm to 10 nm, and a thickness of the Au layer is, for example, in a range of 100 nm to 500 nm.

The metal film 42 is the first metal film in the embodiment. The metal film 42 is provided in a region adjacent to the source electrode 22 with an interval therebetween on the nitride semiconductor layer 4 and has the same laminated structure as the gate electrode 21. That is, when the gate electrode 21 has a laminated structure of Ni/Au, the metal film 42 also has the laminated structure of Ni/Au. Alternatively, when the gate electrode 21 has a laminated structure of Ni/Pd/Au, the metal film 42 also has the laminated structure of Ni/Pd/Au. A thickness of each of the Ni layer, the Pd layer, and the Au layer is the same as that of the gate electrode 21.

In the embodiment, the metal film 42 is provided inside the opening 22a. A planar shape of the metal film 42 is similar to a shape of the opening 22a and is, for example, a rectangular shape or an elliptical shape with the direction D2 as the longitudinal direction. A dimension of the metal film 42 in the direction D2 is, for example, in a range of 20 µm to 100 µm, and a dimension thereof in the direction D1 is, for example, in a range of 10 µm to 50 µm. A distance between an outer edge of the metal film 42 and an inner edge of the opening 22a of the source electrode 22 is, for example, in a range of 1 µm to 5 µm.

The gate wiring 31 is a metal film which covers a part of the gate electrode 21 which is a region extending above the inactive region of the nitride semiconductor layer 4. In the embodiment, a plurality of gate wirings 31 are provided and arranged on one side of the active region of the nitride semiconductor layer 4 in the direction D2. Each of the gate wirings 31 is connected to two or more gate electrodes 21 to form a gate pad and is electrically connected to an external wiring of the transistor 1A via a bonding wire. Thus, a surface of each of the gate wirings 31 is exposed from an opening of an outermost protective film (not shown). Each of the gate wirings 31 has a laminated structure including, for example, a TiW layer and a Au layer on the TiW layer.

The source wiring 32 is the second metal film in the embodiment, covers the corresponding source electrode 22 and metal film 42 and is in contact with an upper surface of the source electrode 22 and an upper surface of the metal film 42. Each of the source wirings 32 has the same laminated structure as the gate wiring 31, for example, the laminated structure including a TiW layer and a Au layer on the TiW layer. Each of the source wirings 32 has, for example, a rectangular shape with the direction D2 as the longitudinal direction.

The drain wiring 33 is a metal film, overlaps the drain electrode on the active region of the nitride semiconductor layer 4 and is provided from the drain electrode to an inactive region. That is, the drain wiring 33 has a plurality of finger portions 33a provided on the active region and a plurality of pad portions 33b provided on the inactive region. The drain wiring 33 has the same laminated structure as the gate wiring 31 and the source wiring 32, for example, laminated structure including a TiW layer and a Au layer on the TiW layer. Each of the finger portions 33a covers the corresponding drain electrode 23 and is in contact with an upper surface of the drain electrode 23. Each of the finger portions 33a has, for example, a rectangular shape with the direction D2 as the longitudinal direction. The plurality of pad portions 33b are provided and arranged in the active region of the nitride semiconductor layer 4 on the other side (the side opposite to the gate wiring 31) in the direction D2. Each of the pad portions 33b is connected to two or more finger portions 33a and is electrically connected to an external wiring of the transistor 1A via a bonding wire. Therefore, a surface of each of the pad portions 33b is exposed from the opening of the outermost protective film (not shown).

The metal via 44 is a metal film provided in a hole 11 which passes through the SiC substrate 3 and the nitride semiconductor layer 4, is continuous with the metal film 42 from the back surface 3b of the SiC substrate 3 and is in contact with the metal film 42. The metal via 44 is provided to electrically connect a back surface metal film 45 provided on the back surface 3b and the source electrode 22 to each other via the source wiring 32 and the metal film 42. When the transistor 1A is mounted on a mount member connected to a ground potential (a reference potential), the mount member and the back surface metal film 45 on the back surface 3b are electrically connected via a conductive adhesive such as solder. Thus, the ground potential is applied to the source electrode 22.

A method for manufacturing the transistor 1A of the embodiment having the above-described configuration will be described. FIGS. 4 to 9 are cross-sectional views showing each of processes included in the method for manufacturing the transistor 1A.

Figure 4:
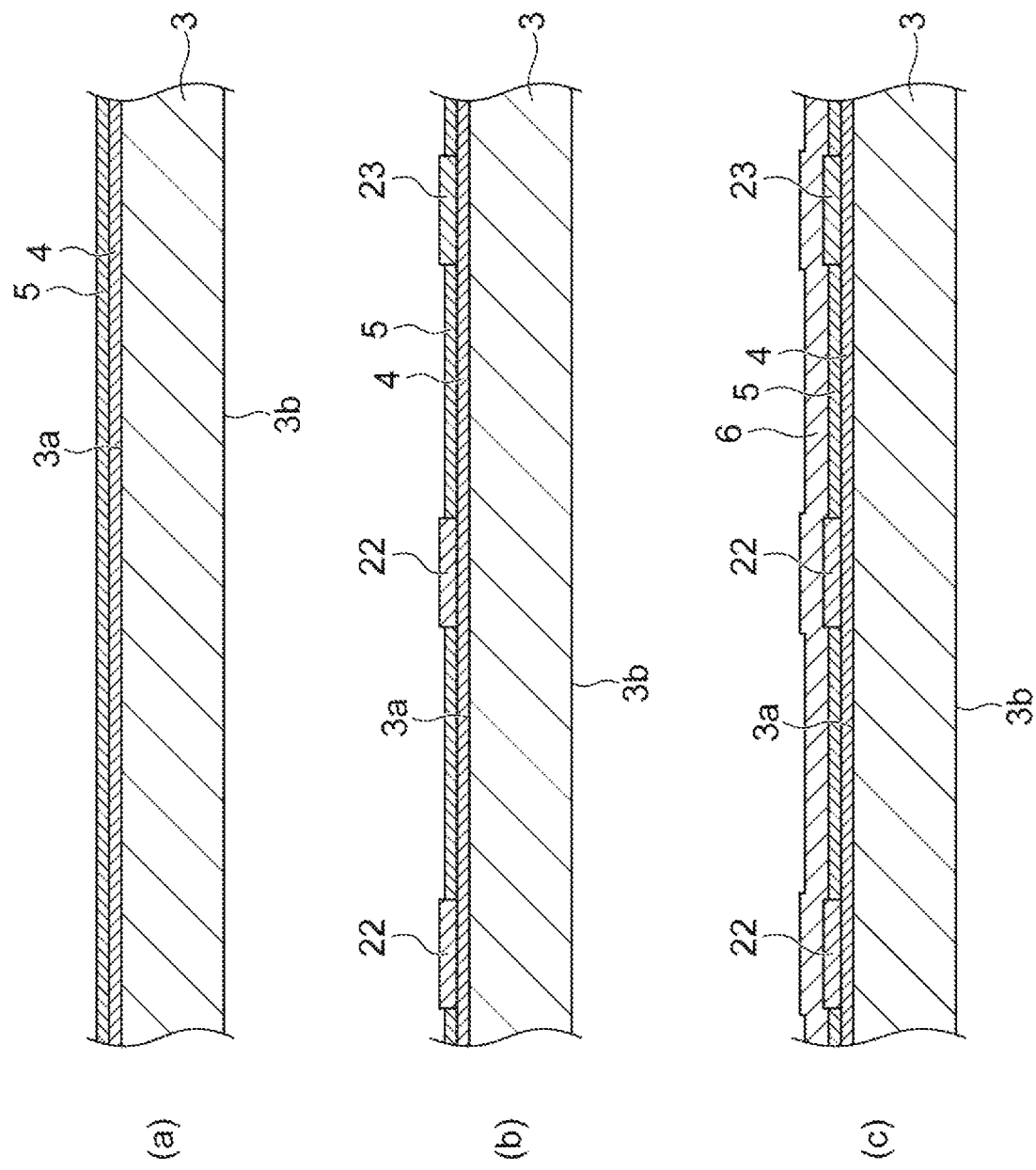
FIG. 4 is a cross-sectional view showing processes included in a method for manufacturing a transistor shown in FIG. 1.

First, as shown in (a) portion of FIG. 4, the SiC substrate 3 is prepared. A thickness of the SiC substrate 3 is, for example, 500 μm. The nitride semiconductor layer 4 is epitaxially grown on main surface 3a of SiC substrate 3. Details of the nitride semiconductor layer 4 are as described above. Subsequently, the insulating film 5 is deposited on the nitride semiconductor layer 4. For example, when the insulating film 5 is formed of a silicon compound such as SiN, the insulating film 5 is deposited by a plasma CVD method or a low pressure CVD (LPCVD) method. As described above, the thickness of the insulating film 5 is in the range of, for example, 10 nm to 30 nm.

Subsequently, as shown in (b) portion of FIG. 4, openings corresponding to the source electrode 22 and the drain electrode 23 are formed in the insulating film 5. Specifically, the openings are formed by forming a resist mask having an opening pattern corresponding to the openings on the insulating film 5 and etching the insulating film 5 through the opening pattern. Thereafter, the source electrode 22 and the drain electrode 23 are formed in the openings using a lift-off method. That is, in a state in which the resist mask remains, each of metal layers (for example, Ti/Al/Ti or Ta/Al/Ta) for the source electrode 22 and the drain electrode 23 is sequentially deposited using a method such as vapor deposition. A thickness of each of the Ti layers (or the Ta layers) is, for example, in a range of 10 nm to 30 nm, and a thickness of the Al layer is, for example, in a range of 200 nm to 400 nm. That is, the source electrode 22 and the drain electrode 23 at this time are a multilayer metal mainly containing Al.

After the metal material deposited on the resist mask is removed together with the resist mask, heat treatment (annealing) is performed at a temperature of 500° C. to 600° C. to alloy the multilayer metal deposited in the previous process. A time for maintaining the temperature in the range of 500° C. to 600° C. is, for example, 1 minute.

Subsequently, as shown in (c) portion of FIG. 4, the insulating film 6 which covers the insulating film 5, the source electrode 22, and the drain electrode 23 is deposited. For example, when the insulating film 6 is formed of a silicon compound such as SiN, the insulating film 6 is deposited by a plasma CVD method.

Figure 5:
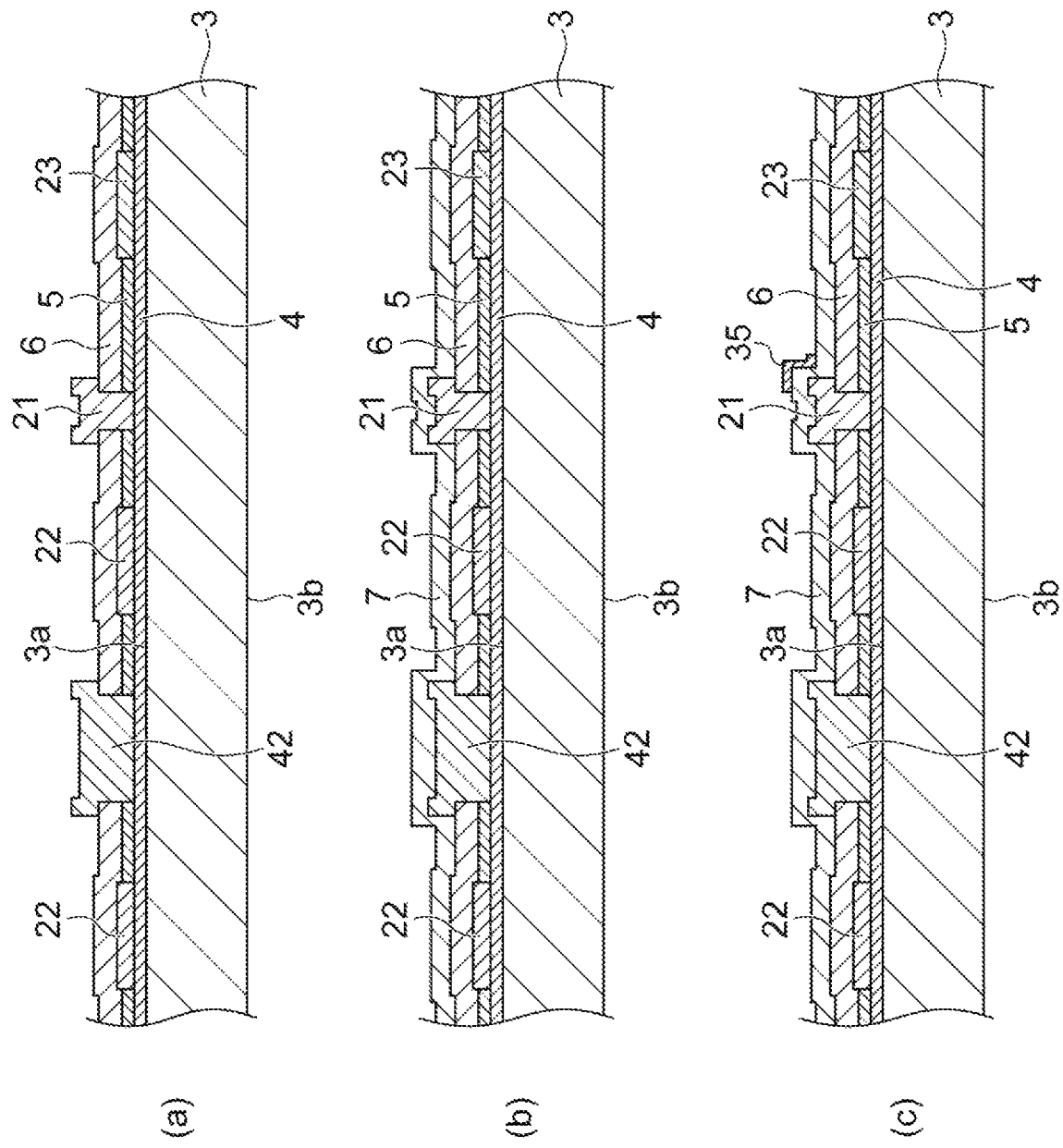
FIG. 5 is a cross-sectional view showing processes included in a method for manufacturing the transistor.

Subsequently, as shown in (a) portion of FIG. 5, the gate electrode 21 and the metal film 42 are formed. First, a photoresist having openings for the gate electrode 21 and the metal film 42 is formed on the insulating film 6. An opening pattern for the gate electrode 21 is formed between the source electrode 22 and the drain electrode 23. An opening pattern for the metal film 42 is formed in a region adjacent to the source electrode 22 with an interval therebetween (for example, in an opening formed in the source electrode 22).

Next, the insulating film 6 and the insulating film 5 are successively etched through the opening pattern of the photoresist, and thus the openings which pass through the insulating films 5 and 6 are formed, and the nitride semiconductor layer 4 is exposed. Thereafter, the gate electrode 21 and the metal film 42 are formed in the respective openings of the corresponding insulating films 5 and 6 using the lift-off method. That is, in a state in which the photoresist remains, each of metal layers (for example, Ni/Au or Ni/Pd/Au) for the gate electrode 21 and the metal film 42 is sequentially deposited by vapor deposition or the like. As described above, the thickness of the Ni layer is, for example, in the range of 50 nm to 100 nm, the thickness of the Pd layer is, for example, in the range of 20 nm to 70 nm, and the thickness of the Au layer is, for example, in the range of 100 nm to 500 nm. Then, the metal material deposited on the photoresist is removed together with the photoresist.

Subsequently, as shown in (b) portion of FIG. 5, the insulating film 7 which covers the insulating film 6, the gate electrode 21, and the metal film 42 is deposited. For example, when the insulating film 7 is formed of a silicon compound such as SiN, the insulating film 7 is deposited by a plasma CVD method.

Subsequently, as shown in (c) portion of FIG. 5, the field plate 35 is formed along the gate electrode 21. In this process, the field plate 35 is formed using, for example, a lift-off method. That is, a resist mask having an opening pattern corresponding to the planar shape of the field plate 35 is formed, and each of metal layers (for example, Ti/Au) for the field plate 35 is sequentially deposited using a method such as vapor deposition. Then, the metal material deposited on the resist mask is removed together with the resist mask.

Figure 6:
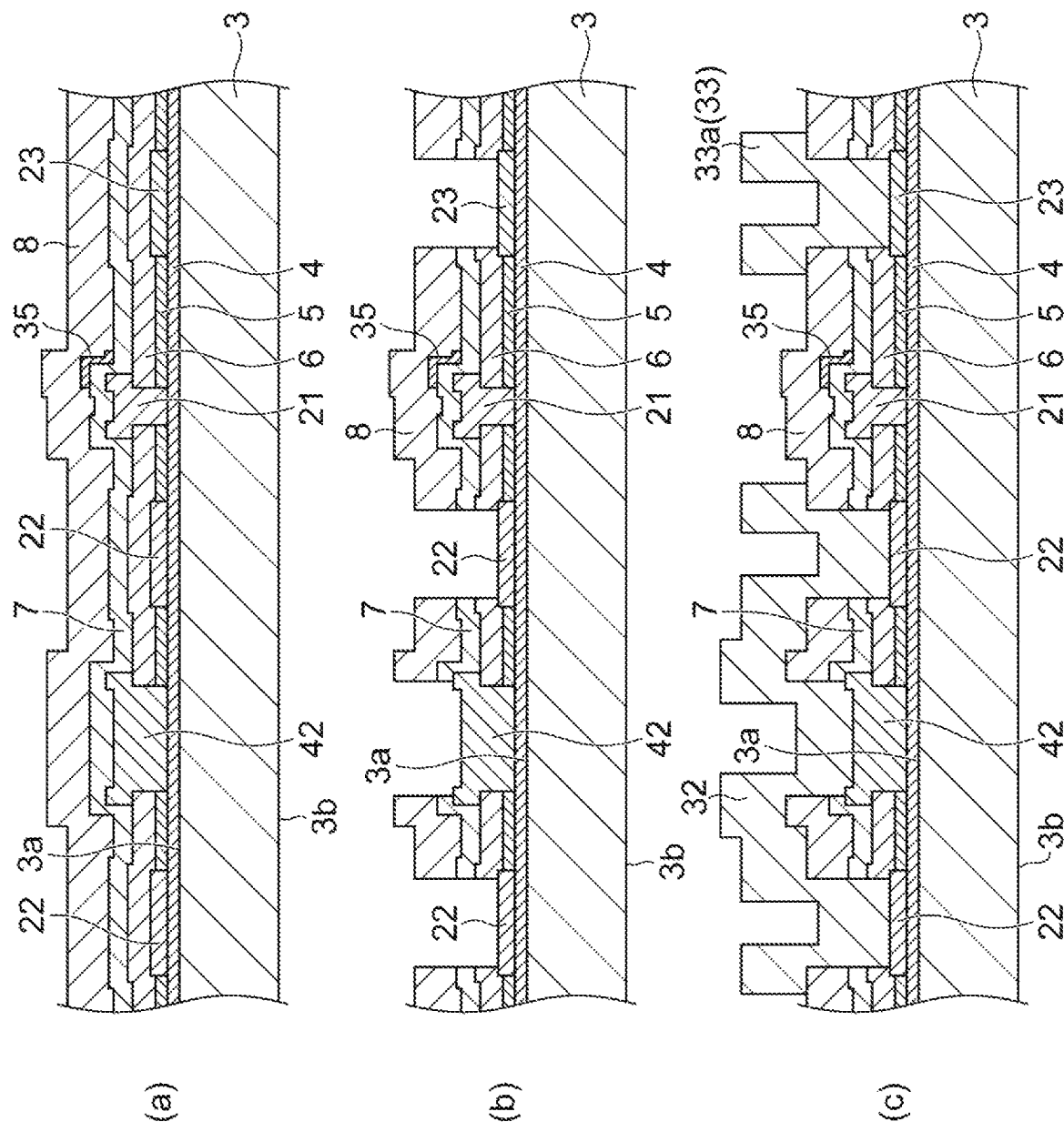
FIG. 6 is a cross-sectional view showing processes included in a method for manufacturing the transistor.

Subsequently, as shown in (a) portion of FIG. 6, the insulating film 8 which covers the insulating film 7 and the field plate 35 is deposited. For example, when the insulating film 8 is formed of a silicon compound such as SiN, the insulating film 8 is deposited by a plasma CVD method.

Subsequently, as shown in (b) portion of FIG. 6, the insulating films 7 and 8 on the metal film 42 are removed by etching to form openings, and the metal film 42 is exposed. At the same time, the insulating films 6, 7, and 8 on the source electrode 22 and the drain electrode 23 are removed by etching to form openings, and the source electrode 22 and the drain electrode 23 are exposed. At the same time, the insulating films 5 to 8 in the regions respectively corresponding to the gate wiring 31 and the pad portion 33b of the drain wiring 33 are removed by etching to form openings, and the nitride semiconductor layer 4 is exposed.

Subsequently, as shown in (c) portion of FIG. 6, the gate wiring 31, the source wiring 32, and the drain wiring 33 are formed simultaneously in parallel. Specifically, a seed metal layer (TiW/Au) which covers the metal film 42, the source electrode 22, the drain electrode 23 and the nitride semiconductor layer 4 which are exposed from the openings formed in the insulating films 5 to 8, and the insulating film 8 is formed by a sputtering method. Then, a resist mask having openings in regions in which the gate wiring 31, the source wiring 32, and the drain wiring 33 are to be formed is formed on the seed metal layer. Thereafter, plating is performed to form a Au layer in the openings of the resist mask. At this time, a thickness of the Au layer is, for example, 5 μm. After the plating process, the resist mask is removed.

Subsequently, a protective film (a passivation film) is formed on the entire surface on the main surface 3a, openings are formed on the gate wiring 31 and the pad portion 33b of the drain wiring 33, and the gate wiring 31 and the pad portion 33b are exposed. Thus, the processes on the main surface 3a side are completed.

Figure 7:
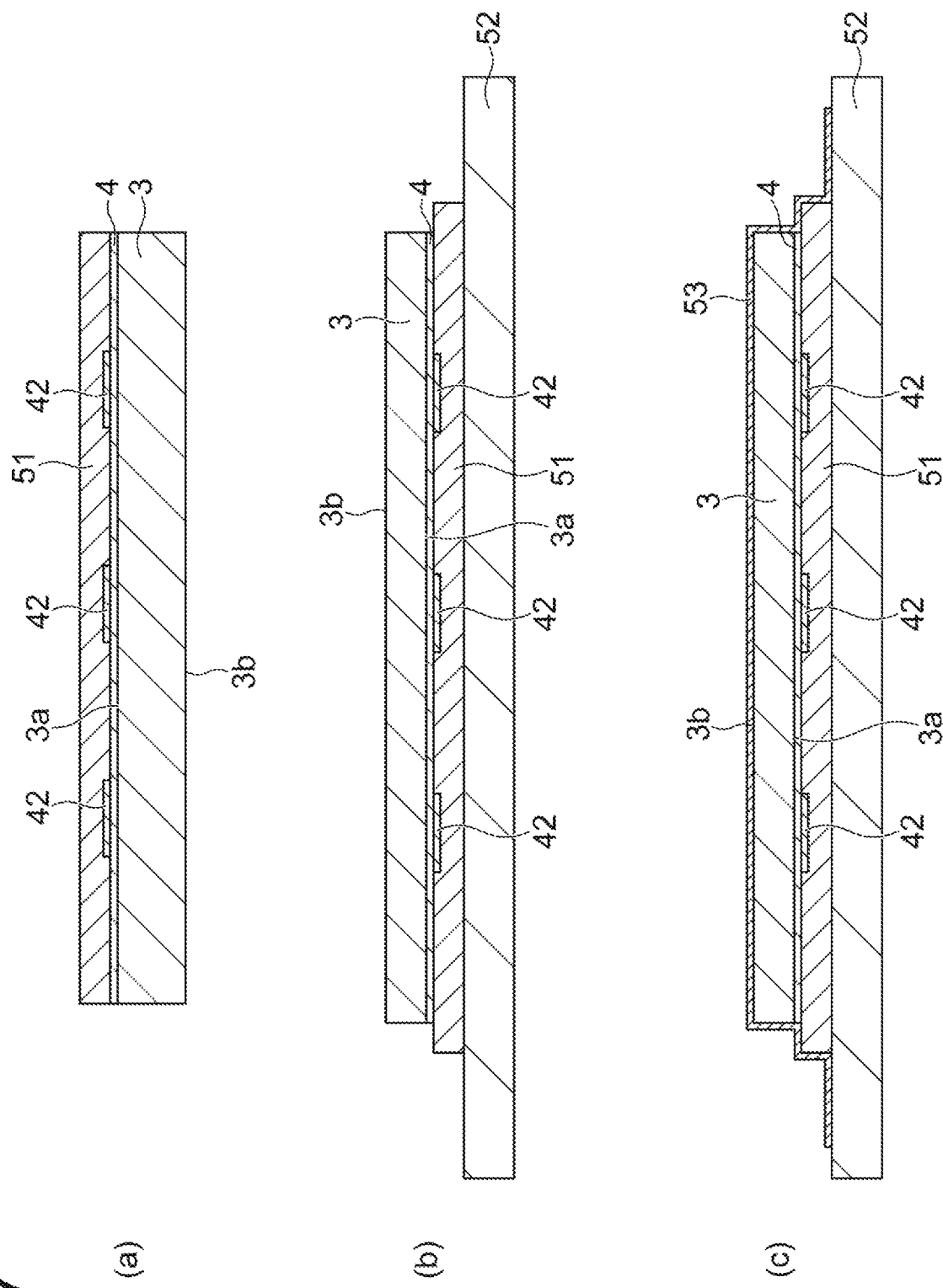
FIG. 7 is a cross-sectional view showing processes included in a method for manufacturing the transistor.

Subsequently, as shown in (a) portion of FIG. 7, a protective resist 51 is formed on the main surface 3a by spin coating, and the resist 51 covers all components on the main surface 3a. Next, as shown in (b) portion of FIG. 7, a support substrate 52 is attached to the resist 51. The support substrate 52 is, for example, a glass plate. Subsequently, polishing of the back surface 3b of the SiC substrate 3 is performed to thin the SiC substrate 3. At this time, for example, the SiC substrate 3 having a thickness of 500 μm is thinned to 100 μm.

Subsequently, as shown in (c) portion of FIG. 7, a seed metal film 53 (for example, TiW/Au) is formed on the back surface 3b and the side surface of the SiC substrate 3 by, for example, a sputtering method. Then, as shown in (a) portion of FIG. 8, after a resist pattern 55 is formed at a position which faces the metal film 42, a Ni mask 54 is formed by performing a Ni plating process. Thereafter, as shown in (b) portion of FIG. 8, the resist pattern 55 is removed, and the exposed seed metal film 53 is removed by etching. Accordingly, a region of the back surface 3b which faces the metal film 42 is exposed through openings of the Ni mask 54. When the seed metal film 53 is formed of TiW/Au, the seed metal film 53 can be easily removed by reactive ion etching (RIE) using a fluorine-based gas.

Figure 8:
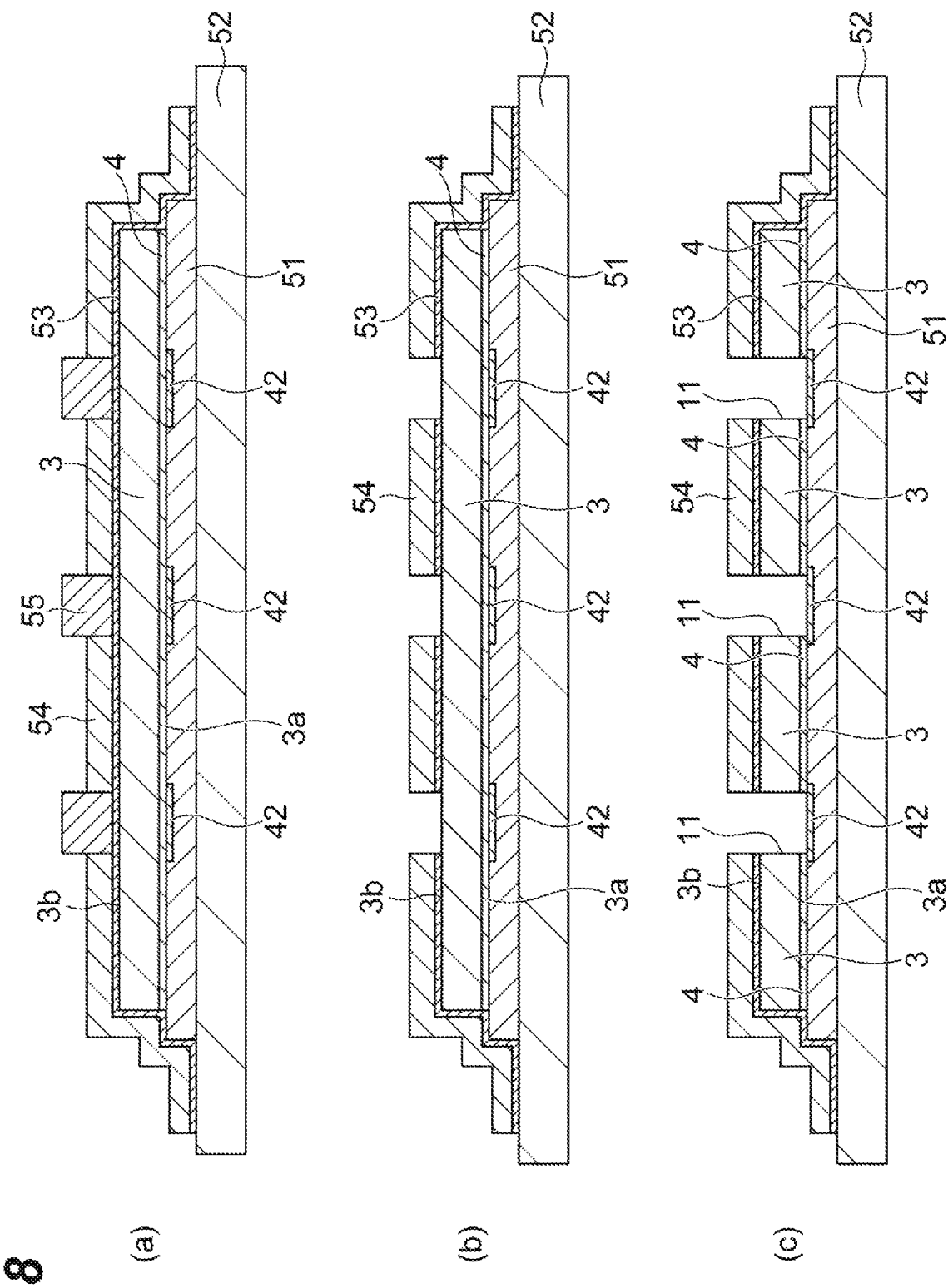
FIG. 8 is a cross-sectional view showing processes included in a method for manufacturing the transistor.

Subsequently, as shown in (c) portion of FIG. 8, holes 11 which pass through the SiC substrate 3 and the nitride semiconductor layer 4 are formed by etching the SiC substrate 3 and the nitride semiconductor layer 4 through the openings of the Ni mask 54. The holes 11 are continuous with the metal film 42 from the back surface 3b of the SiC substrate 3. Thus, the metal film 42 is exposed to the back surface 3b through the holes 11.

In this process, the holes 11 are formed by so-called pulse etching in which etching is performed intermittently. The etching method is, for example, reactive ion etching (RIE). Specifically, after the SiC substrate 3 is etched by RIE using a fluorine-based gas, the reactive gas is changed, and the nitride semiconductor layer 4 is etched by RIE using a chlorine-based gas. When the SiC substrate 3 is etched, fluorine ions derived from the fluorine-based gas are intermittently radiated onto the SiC substrate 3. When the nitride semiconductor layer 4 is etched, chlorine ions derived from the chlorine-based gas are intermittently radiated onto the nitride semiconductor layer 4. When the nitride semiconductor layer 4 is etched, the etching may be performed continuously from the SiC substrate 3 with the fluorine-based gas, and the nitride semiconductor layer 4 may be etched by a sputtering effect thereof. Also in this case, the nitride semiconductor layer 4 may be intermittently irradiated with fluorine ions derived from the fluorine-based gas.

The metal film 42 includes a Ni layer and a Au layer on the Ni layer, and when the etching of the nitride semiconductor layer 4 proceeds, the Ni layer is first exposed. At this time, the Ni layer is slightly etched by the chlorine-based gas, but an etching rate of Ni due to the chlorine-based gas is much lower than that of the nitride semiconductor due to the chlorine-based gas. Therefore, the etching of the metal film 42 can be stopped. Even when the Ni layer is removed by the sputtering effect, the etching with the chlorine-based gas is reliably stopped in the Au layer because the Au layer which is much thicker than the Ni layer is provided on the Ni layer.

Here, in the above-described etching process, the Ni mask 54 may be removed at a stage when the entire SiC substrate 3 has been etched, and then the nitride semiconductor layer 4 may be etched with the chlorine-based gas. The Ni mask 54 needs to be removed by the next process, but immediately after the holes 11 are formed, the Ni layer of the metal film 42 is exposed in the holes 11. When the process of removing the Ni mask 54 is performed in this state, the Ni layer of the metal film 42 is also removed at the same time. Therefore, the Ni mask 54 is removed before the Ni layer of the metal film 42 is exposed, that is, after the etching of the SiC substrate 3 is completed and before the etching of the nitride semiconductor layer 4 starts. The Ni mask 54 is removed using, for example, dilute nitric acid.

Figure 9:
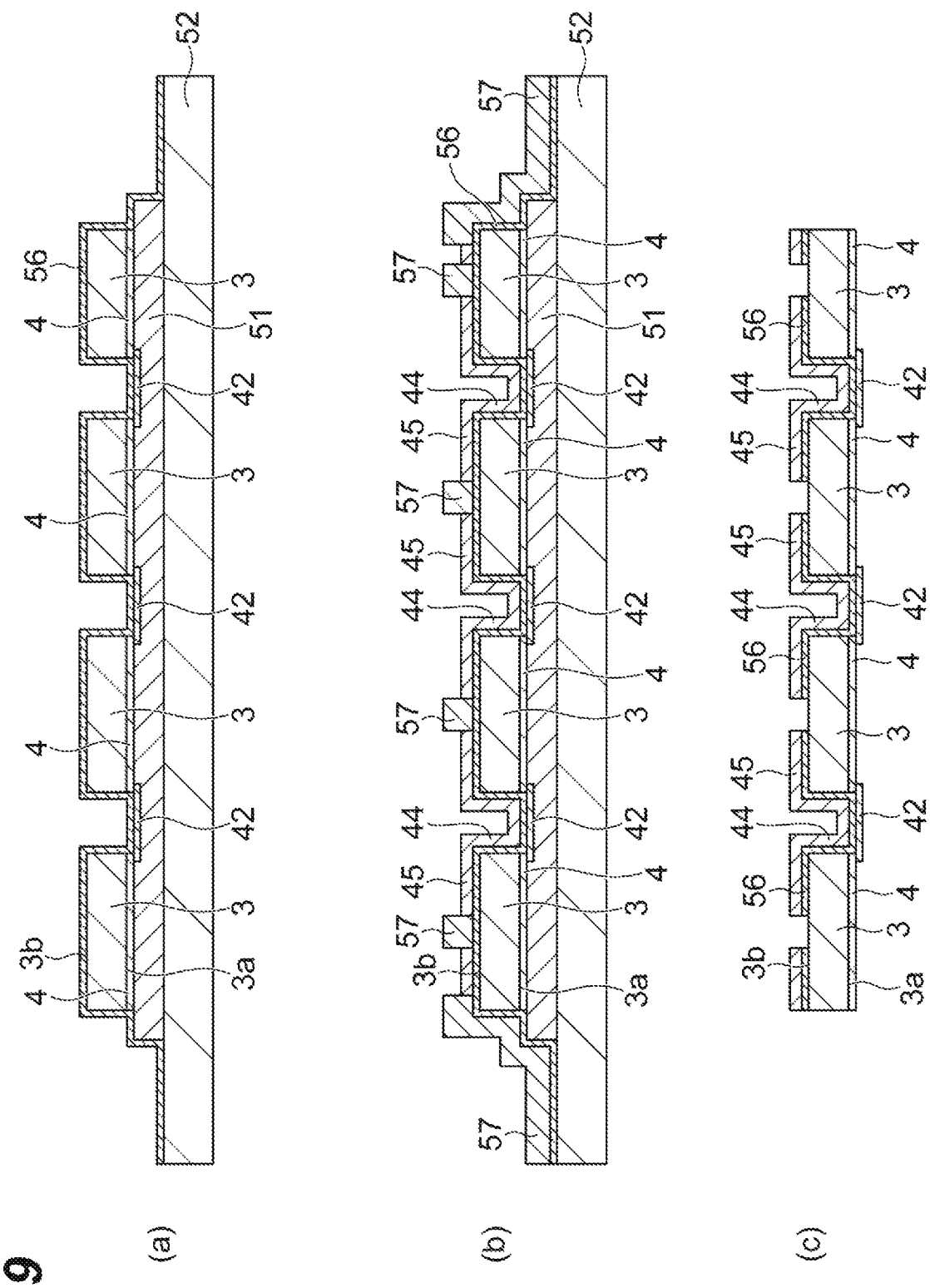
FIG. 9 is a cross-sectional view showing processes included in a method for manufacturing the transistor.

Subsequently, as shown in (a) portion of FIG. 9, a seed metal film 56 (for example, TiW/Au) is formed on the back surface 3b of the SiC substrate 3 and inner surfaces of the holes 11 (including the exposed metal film 42) by, for example, a sputtering method. Then, as shown in (b) portion of FIG. 9, a resist pattern 57 is formed in a region which overlaps a scribe line. Then, the back surface metal film 45 is formed on the back surface 3b and the metal via 44 which is continuous with the metal film 42 from the back surface 3b is formed in the hole 11 by plating the seed metal film 56 exposed from the resist pattern 57. Thereafter, as shown in (c) portion of FIG. 9, the resist pattern 57 is removed, and the exposed seed metal film 56 is removed by etching.

Eventually, the protective resist 51 is removed to separate the components on the main surface 3a of the SiC substrate 3 from the support substrate 52. After a substrate product including the extracted SiC substrate 3 and nitride semiconductor layer 4 is cleaned, dicing is performed along the scribe line to separate individual chips from each other. Through the above-described processes, the transistor 1A of the embodiment is completed.

Advantageous effects obtained by the transistor 1A and the method of manufacturing the transistor 1A according to the above-described embodiment will be described. In the embodiment, the metal film 42 is formed in a region adjacent to the source electrode 22 with an interval therebetween. The metal film 42 has a laminated structure including a Ni layer and a Au layer on the Ni layer. Then, the metal film 42 and the source electrode 22 are connected to each other via the source wiring 32, and the metal via 44 which extends from the back surface 3b of the SiC substrate 3 is in contact with the metal film 42. Therefore, the metal via 44 can be realized immediately below the source finger (the source wiring 32), and the high-frequency characteristics can be improved (specifically, the gain can be improved and stabilized by reducing a source inductance).

When the hole 11 for the metal via 44 are formed in the nitride semiconductor layer 4 using a chlorine-based gas, the Ni layer of the metal film 42 has high etching resistance to chlorine-based gas, and thus the metal film 42 can be used as an etching stop film. Therefore, the holes 11 can be easily formed immediately below the source finger (the source wiring 32). That is, the metal via 44 can be easily formed.

In the embodiment, the metal film 42 has the same laminated structure as the gate electrode 21, and the gate electrode 21 and the metal film 42 are formed simultaneously. In this case, there is no need to add a process for forming the metal film 42, and the number of processes can be reduced.

As in the embodiment, in the process of forming the holes 11, after the SiC substrate 3 is etched by RIE using a fluorine-based gas, the nitride semiconductor layer 4 may be etched by RIE using a chlorine-based gas. In this case, each of the SiC substrate 3 and the nitride semiconductor layer 4 can be easily etched. In this case, fluorine ions derived from the fluorine-based gas may be intermittently radiated onto the SiC substrate 3. Similarly, chlorine ions derived from the chlorine-based gas may be intermittently radiated onto the nitride semiconductor layer 4.

In recent years, with miniaturization of the transistor 1A, miniaturization of the metal via 44 has also been required. In order to miniaturize the metal via 44, it is necessary to miniaturize the holes 11, but as an inner diameter of each of the holes 11 decreases, an aspect ratio increases. When the aspect ratio of the hole 11 increases, it is difficult for molecules and ions which have been decomposed and regenerated during etching to be discharged from the inside of the holes 11. Therefore, it becomes difficult for etching species to enter the holes 11, and the etching rate is greatly reduced. Further, when a semiconductor having a wide band gap such as a nitride semiconductor is etched, not only chemical etching but also physical etching are required. Therefore, high power is required at the time of etching, and the vicinity of a bottom portion of the hole 11 is charged by influence of incident ions. When the vicinity of the bottom portion of the hole 11 is charged, an effect of the physical etching is weakened, and the etching rate is greatly reduced. Such a tendency is more remarkable as the aspect ratio of the hole 11 is larger.

As in the embodiment, when a so-called pulse etching method in which fluorine ions derived from a fluorine-based gas and chlorine ions derived from a chlorine-based gas are intermittently radiated onto the SiC substrate 3 and the nitride semiconductor layer 4 is used, molecules and ions which have decomposed and regenerated during the etching are easily discharged from the inside of the hole 11, and charging of the vicinity of the bottom portion of the hole 11 can be reduced. Therefore, it is possible to curb a decrease in the etching rate and to easily form the holes 11 having a large aspect ratio.

As in the embodiment, the metal film 42 may be formed in the opening 22a of the source electrode 22. In this case, each of the pair of side surfaces of the source electrode 22 can face the gate electrode 21, and the respective electrodes can be efficiently disposed to miniaturize the transistor 1A.

As in the embodiment, the laminated structures of the gate electrode 21 and the metal film 42 may include a Pd layer between the Ni layer and the Au layer. In this case, adhesion between the Ni layer and the Au layer is increased, and the gate electrode 21 and the metal film 42 can be formed more firmly.

As in the embodiment, the process of forming the source electrode 22 and the drain electrode 23 may include a process of alloying a multilayer metal mainly containing Al at a temperature in a range of 500° C. to 600° C. When the holes 11 are formed toward the source electrode 22 mainly containing Al, the source electrode 22 is easily etched by the chlorine-based gas. This is because the etching rates of Al and the nitride semiconductor with respect to the chlorine-based gas are substantially equal to each other. Therefore, it is difficult to form the holes 11 immediately below the source electrode 22 mainly containing Al. In the embodiment, since the holes 11 are formed toward the metal film 42, such a problem can be avoided, and the holes 11 can be easily formed.

Modified Example

Figure 10:
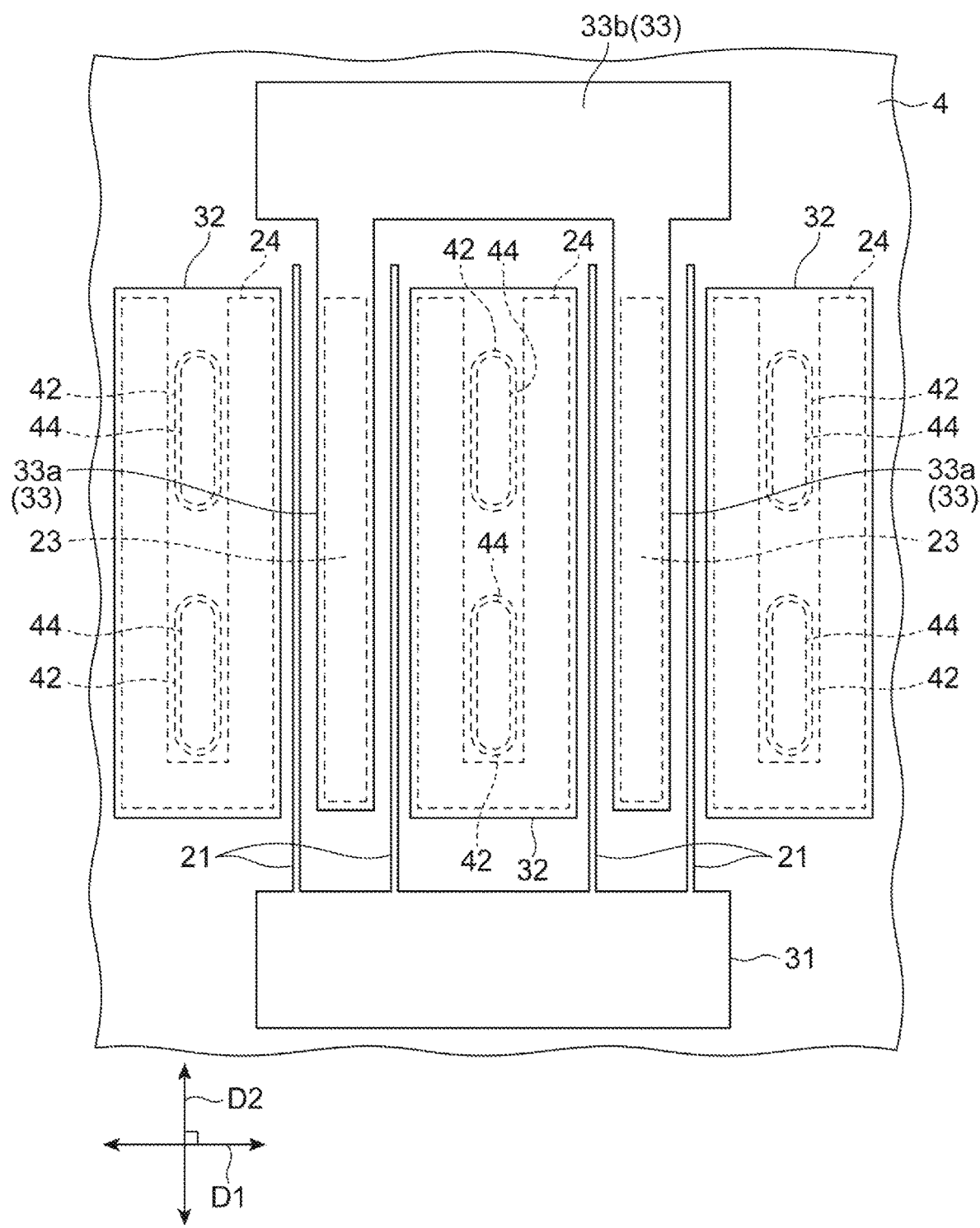
FIG. 10 is an enlarged plan view of a transistor according to a modified example.

The source electrode 22 may have any planar shape as long as it is adjacent to the metal film 42 with an interval therebetween. FIG. 10 is an enlarged plan view of a transistor 1B according to a modified example of the above-described embodiment. A difference between the modified example and the above-described embodiment is a shape of the source electrode. The source electrode 22 of the above-described embodiment has one or a plurality of openings 22a, but a source electrode 24 of the modified example has a planar shape such as an U shape with one end being open in the direction D2. Additionally, one or a plurality of metal films 42 are provided inside the U shape. When the transistor 1B is manufactured, after the source electrode 24 is formed in an U shape, one or a plurality of metal films 42 are formed inside the U shape. Also in such a mode, the advantageous effects of the above-described embodiment can be obtained similarly.

The method for manufacturing a semiconductor device and the semiconductor device according to the present disclosure are not limited to the above-described embodiment and the modified example, and various other modifications are possible. For example, although the holes 11 are formed by pulse etching in the above-described embodiment, when the aspect ratio of the holes 11 is small or the like, fluorine ions derived from a fluorine-based gas and chlorine ions derived from a chlorine-based gas may be continuously radiated onto each of the SiC substrate and the nitride semiconductor layer.

What is claimed is:

1. A method for manufacturing a semiconductor device, the method comprising:
    forming a first source electrode, a second source electrode adjacent to the first source electrode, and a drain electrode on a nitride semiconductor layer formed on a main surface of a SiC substrate;
    forming a gate electrode between the first source electrode and the drain electrode on the nitride semiconductor layer;
    forming a first metal film in a region between the first source electrode and the second source electrode with an interval therebetween;
    forming an insulating film in the interval, after forming the first metal film;
    forming a second metal film over the insulating film, the second metal film being electronically connected between the first source electrode, the second source electrode, and the first metal film;
    forming a hole being continuous with the first metal film from a back surface of the SiC substrate; and
    forming a metal via being continuous with the first metal film from the back surface in the hole.

2. The method for manufacturing a semiconductor device according to claim 1, wherein, in the forming of the hole, the SiC substrate is etched by reactive ion etching using a fluorine-based gas, and then the nitride semiconductor layer is etched by reactive ion etching using a chlorine-based gas.

3. The method for manufacturing a semiconductor device according to claim 2, wherein, in the forming of the hole, fluorine ions derived from the fluorine-based gas are intermittently radiated onto the SiC substrate.

4. The method for manufacturing a semiconductor device according to claim 2, wherein, in the forming of the hole, chlorine ions derived from the chlorine-based gas are intermittently radiated onto the nitride semiconductor layer.

5. The method for manufacturing a semiconductor device according to claim 1, wherein the first and second source electrodes have an opening, and the first metal film is formed inside the opening.

6. The method for manufacturing a semiconductor device according to claim 1, wherein the first and second source electrodes have a planar U shape, and the first metal film is formed inside the U shape.

7. The method for manufacturing a semiconductor device according to claim 1, wherein the forming of the first and second source electrodes and the drain electrode includes alloying a multilayer metal mainly containing Al at a temperature in a range of 500° C. to 600° C.

8. The method for manufacturing a semiconductor device according to claim 1, wherein the gate electrode is formed to have a laminated structure including a Ni layer and an Au layer on the Ni layer.

9. The method for manufacturing a semiconductor device according to claim 8, wherein the laminated structure includes a Pd layer between the Ni layer and the Au layer.

10. A semiconductor device comprising:
a SiC substrate;
a nitride semiconductor layer provided on a main surface of the SiC substrate;
a first source electrode, a second source electrode adjacent to the first source electrode, and a drain electrode provided on the nitride semiconductor layer;
a gate electrode provided between the first source electrode and the drain electrode on the nitride semiconductor layer;
a first metal film provided only in a region between the first source electrode and the second source electrode with an interval therebetween on the nitride semiconductor layer;
an insulating film provided on the first metal film and the first source electrode and the second source electrode, and provided between the first metal film and the first source electrode and between the first metal film and the second source electrode;
a second metal film electronically connected to the first source electrode and the second source electrode, and the first metal film, the second metal film being provided over the insulating film; and
a metal via provided in a hole of the SiC substrate, the metal via being continuous from a back surface of the SiC substrate to the first metal film.

11. The semiconductor device according to claim 10, wherein the first and second source electrodes and the drain electrode mainly contain Al.

12. The semiconductor device according to claim 10, wherein the first and second source electrodes have an opening, and the first metal film is provided inside the opening.

13. The semiconductor device according to claim 10, wherein the first and second source electrodes have a planar U shape, and the first metal film is provided inside the U shape.

14. The semiconductor device according to claim 10, wherein the first and second source electrodes have a width of at least 30 μm.

15. A semiconductor device comprising:
a SiC substrate;
a nitride semiconductor layer provided on a main surface of the SiC substrate;
a first source electrode, a second source electrode adjacent to the first source electrode, and a drain electrode provided on the nitride semiconductor layer;
a gate electrode provided between the first source electrode and the drain electrode on the nitride semiconductor layer;
a first metal film provided in a region between the first source electrode and the second source electrode with an interval therebetween on the nitride semiconductor layer;
an insulating film provided on the first metal film and the first source electrode and the second source electrode, and provided between the first metal film and the first source electrode and between the first metal film and the second source electrode;
a second metal film electronically connected to the first source electrode and the second source electrode, and the first metal film, the second metal film being provided over the insulating film; and
a metal via provided in a hole of the SiC substrate, the metal via being continuous from a back surface of the SiC substrate to the first metal film,
wherein the gate electrode has a laminated structure including a Ni layer and an Au layer on the Ni layer, and
wherein the first metal film has a same laminated structure as the gate electrode.

16. A method for manufacturing a semiconductor device, the method comprising:
forming a first source electrode, a second source electrode adjacent to the first source electrode, and a drain electrode on a nitride semiconductor layer formed on a main surface of a SiC substrate;
forming a gate electrode between the first source electrode and the drain electrode on the nitride semiconductor layer;
forming a first metal film in a region between the first source electrode and the second source electrode with an interval therebetween;
forming an insulating film in the interval;
forming a second metal film over the insulating film, the second metal film being electronically connected between the first source electrode, the second source electrode, and the first metal film;
forming a hole being continuous with the first metal film from a back surface of the SiC substrate; and
forming a metal via being continuous with the first metal film from the back surface in the hole,
wherein the gate electrode is formed to have a laminated structure including a Ni layer and an Au layer on the Ni layer, and
wherein the first metal film is formed to have a same laminated structure as the gate electrode.

* * * * *